United States Patent
Micheloni et al.

(10) Patent No.: US 7,068,540 B2
(45) Date of Patent: Jun. 27, 2006

(54) METHOD AND DEVICE FOR PROGRAMMING AN ELECTRICALLY PROGRAMMABLE NON-VOLATILE SEMICONDUCTOR MEMORY

(75) Inventors: Rino Micheloni, Turate (IT); Roberto Ravasio, Carvico (IT)

(73) Assignee: STMicroelectronics S.r.l., Agrate Brianza (MI) (IT)

( * ) Notice: Subject to any disclaimer, the term of this patent is extended or adjusted under 35 U.S.C. 154(b) by 136 days.

(21) Appl. No.: 10/729,829

(22) Filed: Dec. 5, 2003

(65) Prior Publication Data

US 2004/0170061 A1 Sep. 2, 2004

(30) Foreign Application Priority Data

Dec. 5, 2002 (IT) .......................... MI2002A2570

(51) Int. Cl.
*G11C 16/04* (2006.01)
(52) U.S. Cl. ..................... 365/185.19; 365/185.03; 365/185.22; 365/185.29
(58) Field of Classification Search .......... 365/185.29, 365/185.19, 185.03, 185.22
See application file for complete search history.

(56) References Cited

U.S. PATENT DOCUMENTS

| | | | |
|---|---|---|---|
| 6,101,125 A * | 8/2000 | Gorman | 365/185.19 |
| 6,426,892 B1 * | 7/2002 | Shibata et al. | 365/185.03 |
| 2004/0170062 A1 * | 9/2004 | Micheloni et al. | 365/185.29 |

\* cited by examiner

*Primary Examiner*—Anh Phung
*Assistant Examiner*—Toan Le
(74) *Attorney, Agent, or Firm*—Lisa K. Jorgenson; Jose Gutman; Fleit, Kain, Gibbons, Gutman, Bongini & Bianco P.L.

(57) ABSTRACT

A device and method for programming an electrically programmable memory applies at least one first programming pulse to a group of memory cells (MC1–MCk) of the memory, accesses the memory cells of the group to ascertain a programming state thereof, and applies at least one second programming pulse to those memory cells in the group whose programming state is not ascertained to correspond to a desired programming state. A voltage applied to a control electrode of the memory cells is varied between the at least one first programming pulse and the at least one second programming pulse according to a forecasted change in biasing conditions of the memory cells in the group between said at least one first and at least one second programming pulses. Undesired over-programming of the memory cells is thus avoided.

12 Claims, 6 Drawing Sheets

METHOD AND DEVICE FOR PROGRAMMING AN ELECTRICALLY PROGRAMMABLE NON-VOLATILE SEMICONDUCTOR MEMORY

CROSS-REFERENCE TO RELATED APPLICATION

This application is based upon and claims priority from prior Italian Patent Application No. MI2002A002570, filed on Dec. 5, 2002, the entire disclosure of which is herein incorporated by reference.

BACKGROUND OF THE INVENTION

1. Field of the Invention

The present invention generally relates to the field of semiconductor memories, and particularly to electrically programmable non-volatile memories such as, for example, EPROMs, EEPROMs and Flash memories. Specifically, the invention concerns a method and device for programming an electrically programmable non-volatile memory.

2. Description of the Related Art

Non-volatile, electrically programmable semiconductor memories have memory cells formed by MOS transistors, whose threshold voltage is varied electrically to store the desired information.

The number of different values that the threshold voltage of a memory cell may take depends on the number of bits that the memory cell is intended to store. For example, in two-level memories having memory cells intended to store only one bit each, the threshold voltage of any memory cell takes one of two different values, associated with the two opposite binary logic states ("1" and "0"). In multi-level memories, whose memory cells are intended to store more than one bit, the number of different threshold voltage values is equal to $2^n$, where n identifies the number of bits stored in each memory cell. Multi-level memories are also known in which n bits are stored in k memory cells, where k<n and n/k is a non-integer number; in this case, the number of different values that the memory cell threshold voltage may take is higher than two, but not equal to a power of two.

Programming a memory cell means setting the memory cell threshold voltage to the desired value, starting from a memory cell erased condition in which the threshold voltage value is equal to or lower than the lowest of the prescribed values. Typically, in order to increase the memory cell threshold voltage, electrons are injected into a memory cell floating gate of, e.g., polysilicon, or into a memory cell charge-trapping element (typically, a layer of silicon nitride); the electric charge present in the floating gate or charge trapping element affects the formation of a conductive channel when a read gate voltage is applied to a memory cell control gate.

Electrons are for example injected into the floating gate or charge-trapping element by means of the channel hot-electron injection mechanism, triggered by applying suitable programming voltages to the memory cell terminals.

The data stored in the memory cell are retrieved by accessing the memory cell in read conditions. Prescribed read voltages are applied to the memory cell terminals, and the current sunk by the memory cell is sensed. The higher the memory cell threshold voltage, the lower the current sunk by the memory cell. The data stored in the memory cell are thus determined by comparing the sensed current to a prescribed reference current (a plurality of reference currents in the case of a multi-level memory).

Conventional programming algorithms call for applying to the memory cell a sequence of programming pulses; each programming pulse provides for applying to the memory cell terminals the proper programming voltages for a pre-scribed, relatively short time. Each programming pulse determines a slight increase in the memory cell threshold voltage. After each programming pulse, the memory cell threshold voltage is checked (verified) to assess whether the memory cell has been programmed (program verify phase). In order to verify the threshold voltage value, the memory cell is accessed in reading. Typically, in the program verify phase the conditions under which the programming state of the memory cell is ascertained are deliberately made more critical compared to the standard memory cell read access. This means that a memory cell that would be detected as programmed in the standard read conditions may be detected as non-programmed in the program verify conditions, if the memory cell threshold voltage is not adequately high. This assures that the memory cell is programmed with a prescribed margin. Unfortunately, the memory cell may be programmed to and undesired too high level.

Therefore a need exists to overcome the problems discussed above.

SUMMARY OF THE INVENTION

According to preferred embodiments of the present invention a new device and programming method overcome the problems discussed above.

According to an aspect of the present invention, the method comprises:

applying at least one first programming pulse to a group of memory cells of the memory;

accessing the memory cells of the group to ascertain a programming state thereof; and applying at least one second programming pulse to those memory cells in the group whose programming state is not ascertained to correspond to a desired programming state, varying a voltage applied to a control electrode of the memory cells between the at least one first programming pulse and the at least one second programming pulse.

The control electrode voltage is varied by forecasting a change in biasing conditions of the memory cells in the group between said at least one first and at least one second programming pulses; the control electrode voltage is varied according to the forecasted change in biasing conditions.

According to an aspect of the present invention, a device comprises a programming circuit for programming memory cells of an electrically programmable memory, the programming circuit comprises:

a circuit for applying programming pulses to selected groups of memory cells; a variable voltage generator for supplying a variable programming voltage to a control electrode of the memory cells in the group; and a program verify circuit for accessing the memory cells in the group, ascertaining a programming state thereof and causing programming pulses to be repeatedly applied to the memory cells in the group until the programming state thereof is not ascertained to correspond to a desired programming state, varying the control electrode voltage; wherein it comprises means for forecasting a change in memory cell bias conditions between successive programming pulses and for causing the variable voltage generator to generate a voltage depending on the forecasted change in memory cell bias conditions.

BRIEF DESCRIPTION OF THE DRAWINGS

The features and advantages of the present invention will be made apparent by the following detailed description of an embodiment thereof, provided merely by way of non-limitative example, which will be made in connection with the attached drawings, wherein.

DESCRIPTION OF THE PREFERRED EMBODIMENTS

The Applicant has observed that if a voltage applied to the memory cell control gate is progressively increased at each programming pulse, the memory cell threshold voltage progressively increases following the increase in the control gate voltage; for example, if a voltage ramp is applied to the memory cell control gate, the evolution of the memory cell threshold voltage follows a similar ramp, simply offset with respect to the control gate voltage ramp. This technique, allowing to finely control the threshold voltage evolution in time during programming, is particularly useful for programming multi-level memories, in which the threshold voltage values associated with the different binary logic states are relatively close to each other and, differently from two-level memories, one must be capable to set the memory cell threshold voltages at prescribed values, and not generically shift the threshold voltage above a predefined, minimum value.

The Applicant has however observed that the relation between the evolution in time of the control gate voltage and that of the memory cell threshold voltage also depends on the electric potentials of the other electrodes of the memory cell, namely the source potential, the drain potential and the body or bulk potential. In particular, the potentials of the other memory cell electrodes determine the entity of the offset of memory cell threshold voltage ramp with respect to the control gate voltage ramp.

Thus, the threshold voltage evolution in time can be controlled provided that the potentials of the other memory cell electrodes do not change during the programming.

Regretfully, the Applicant has observed that there are factors causing the actual potentials of the electrodes of a memory cell in a memory to depart from the expected potentials. These factors include for example parasitic resistances of the supply voltage lines and signal lines, such as the resistances unavoidably present in series to the memory cell source, drain and bulk electrodes, and the output resistance of the voltage regulators providing the necessary programming voltages (e.g., the drain voltage). Diffusion resistances, metal line resistances and contact resistances, just to cite some, add up to give non-negligible overall values.

These parasitic resistances introduce voltage drops, which depend on the currents flowing therethrough.

The memory cells are normally programmed by groups, sometimes also referred to as pages, of, e.g., sixteen, thirty-two or even sixty-four memory cells. When the programming voltages are applied to a non-programmed memory cell, a relatively high current flows from the drain to the source, and through the bulk. As soon as a memory cell is verified to have been programmed to the desired level (i.e., the threshold voltage of the cell has reached the desired value), it is disconnected from a respective program load circuit, supplying the prescribed drain potential: in this way, the cell will not be applied further programming pulses. As the programming procedure goes on, more and more cells of the page are progressively disconnected from the respective program load circuits. When a cell is disconnected from the respective program load circuit, it ceases sinking current; consequently, the overall current sunk by the cells of the memory page being programmed decreases as the programming procedure goes on. Due to the decrease in these currents, the voltage drops across the parasitic resistances also decrease: the actual electric potentials of the memory cell electrodes thus vary during the programming procedure.

A consequence of all this is that the threshold voltage of the memory cells cannot be controlled, and it may happen that the cells are programmed to undesired, too high levels. If this occurs, the memory page needs to be erased again, and the programming procedure repeated.

The Applicant has also observed that this problem affects both two-level and multi-level memories, but in the latter case it is particularly felt, because of the fact that the different threshold voltage levels are close to each other.

Figure 1:
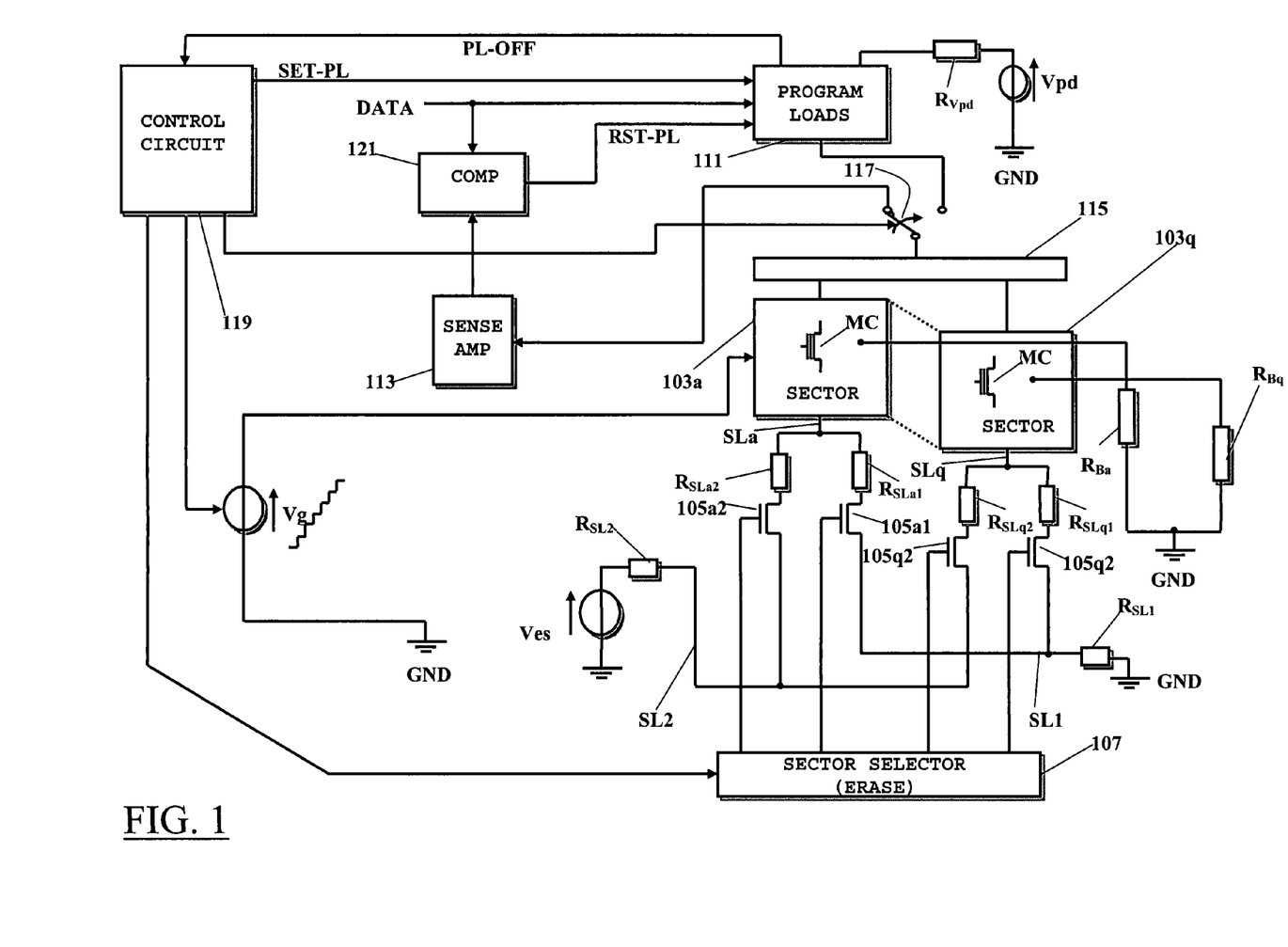
FIG. 1 schematically shows an electrically programmable, non-volatile memory in terms of the main functional blocks.

Referring to the drawings, and particularly to FIG. 1, an electrically programmable, non-volatile semiconductor memory is schematically shown in terms of the main functional blocks. In particular, in the exemplary and non-limitative embodiment of the invention herein discussed, the memory is a Flash memory.

The memory comprises a plurality of memory sectors $103a, \ldots, 103q$. Each memory sector includes a two-dimensional array of memory cells MC, conventionally arranged by rows (word lines) and columns (bit lines). The memory cells MC are for example floating-gate MOS transistors, being intended that any other electrically programmable non-volatile memory cell structure may as well be used. The number of memory sectors, the number of memory cells in each memory sector, the number of rows and columns by which the memory cells in each sector are arranged depend on several factors, such as the overall memory size and the applications for which the memory is designed; in any case, these parameters are not critical for the present invention.

The memory sectors $103a, \ldots, 103q$ comprise conventional row and column selection circuits (hereinafter referred to as word line selector and bit line selector, respectively), not shown in detail in FIG. 1 for the sake of clarity of the drawing, for selecting the memory sector rows and columns.

The memory cells MC may be intended to store one bit (two-level memory) or more bits (multi-level memory); in the former case, the memory cell threshold voltage can take either one of two different values, the lower value being conventionally associated with the "1" logic state, and the higher value being associated with the "0" state. In the case of a multi-level memory, the memory cell threshold voltage can take any one of a plurality of different values, e.g., four different values for memory cells capable of storing two bits each: the first, lowest value is conventionally associated with the "11" state, the second value is associated with the "10" state, the third value is associated with the "01" state and the highest value is associated with the "00" state. Opposite conventions can of course be adopted. More generally, in a multi-level memory the number of different values that the memory cell threshold voltage can take may be equal to a power of two, in which case the memory cell store n bits, or the number of such different values may be any integer different from a power of two, in which case n bits are stored in a group of k memory cells, with k<n.

Each memory sector $103a, \ldots, 103q$ has an independent source line $SLa, \ldots, SLq$, supplying a source potential to the memory cells MC of that memory sector. Source line selectors $105a1, 105a2, \ldots, 105q1, 105q2$ are associated with each source line $SLa, \ldots, SLq$. The source line selectors $105a1, 105a2, \ldots, 105q1, 105q2$, in the exemplary embodiment shown formed by pass transistors, e.g. N-channel MOSFETs, are controlled by an erase sector selection circuit 107, and allow selectively connecting the source lines $SLa, \ldots, SLq$ of the memory sectors to a first common source line SL1, connected to a reference voltage GND (ground), or to a second common source line SL2, connected to an output of a charge pump generating an erase source voltage Ves, for example a relatively high positive voltage. A memory control circuit 119 controls the erase sector selection circuit 107 which, depending on the operation to be carried out, selectively turns the source line selectors $105a1, 105a2, \ldots, 105q1, 105q2$ on and off, so as to connect the source lines $SLa, \ldots, SLq$ to the common source line SL1 or SL2. In particular, when a given memory sector is accessed in read or program, all the sector source lines $SLa, \ldots, SLq$ are connected to the common source line SL1, and thus to ground; on the contrary, when a given memory sector is accessed in erase, the respective sector source line is connected to the common source line SL2, and thus to the erase source voltage, while all the remaining sector source lines are connected to the common source line SL1, and thus to ground.

Associated with the memory sectors $103a, \ldots, 103q$ are a program load circuit 111 and a sense amplifier circuit 113. A conventional sector selection decoding circuitry 115 enables connecting the program load circuit and/or the sense amplifier circuit, depending on the operation to be conducted, to the selected memory sector.

The bit lines selected by the column selection circuit of the selected memory sector can be selectively connected to the program load circuit 111 or to the sense amplifier circuit 113, depending on the operation to be conducted (read or program). In particular, switch means 117, controlled by the memory control circuit 119, allow connecting the selected memory cell columns to the program load circuit 111 when the memory cells belonging to the selected bit lines are to be programmed, and to the sense amplifier circuit 113 when the memory cells belonging to the selected bit lines are to be read, for conducting either a standard read or a program verify read.

The program load circuit 111 receives control signals from the memory control circuit 119. In particular, the program load circuit 111 receives from the memory control circuit 119 a control signal SET-PL which, when asserted, causes the program load circuit 111 to connect all the selected bit lines of the selected memory sector to the output of a voltage regulator providing a program voltage Vpd for the drain electrodes of the memory cells. The program load circuit 111 also receives a data word DATA to be written into selected memory cells of the selected memory sector. The data word DATA defines a write pattern for the selected memory cells.

A comparator circuit 121 receives and compares the data word DATA and an output of the sense amplifier circuit 113 carrying data read from selected memory cells of the selected memory sector during a program verify read access. The comparator circuit 121 generates a plurality of signals, globally indicated in FIG. 1 by RST-PL, which, depending on the outcome of the comparison, are selectively asserted for causing the program load circuit 111 to selectively disconnect some or all of the selected bit lines of the selected memory sector from the output of the program drain voltage regulator, as will be better described later on.

The memory control circuit 119 may for example be implemented by means of a state machine.

The memory control circuit 119 also controls a variable voltage generator Vg, generating a variable programming gate voltage to be applied to the selected word lines of the memory sectors during programming.

Also shown in FIG. 1 in terms of lumped circuit elements are some of the parasitic components present in the circuit, responsible of the problem discussed in the introductory part of this description. In particular, lumped circuit elements $R_{SLa1}, R_{SLa2}, \ldots, R_{SLq1}, R_{SLq2}$ represent parasitic resistances associated with the sector source lines $SLa, \ldots, SLq$ and the source line selectors $105a1, 105a2, \ldots, 105q1, 105q2$; lumped circuit elements $R_{SL1}$ and $R_{SL2}$ represent parasitic resistances associated with the common source lines SL1 and SL2, respectively; lumped circuit elements $R_{Ba}, \ldots, R_{Bq}$ represent parasitic resistances associated with the bulk electrodes of the memory cells: these parasitic resistances include for example resistances associated with doped semiconductor wells wherein the memory cells are formed, resistances associated with metal lines carrying bulk biasing potentials, contact resistances. A lumped circuit element $R_{Vpd}$ represents an output resistance of the voltage regulator providing the program voltage Vpd for the drain electrodes of the memory cells; the lumped circuit element $R_{Vpd}$ is also intended to represent the parasitic resistance of the voltage supply line carrying the program voltage Vpd to the program load circuit 111.

Figure 2A:
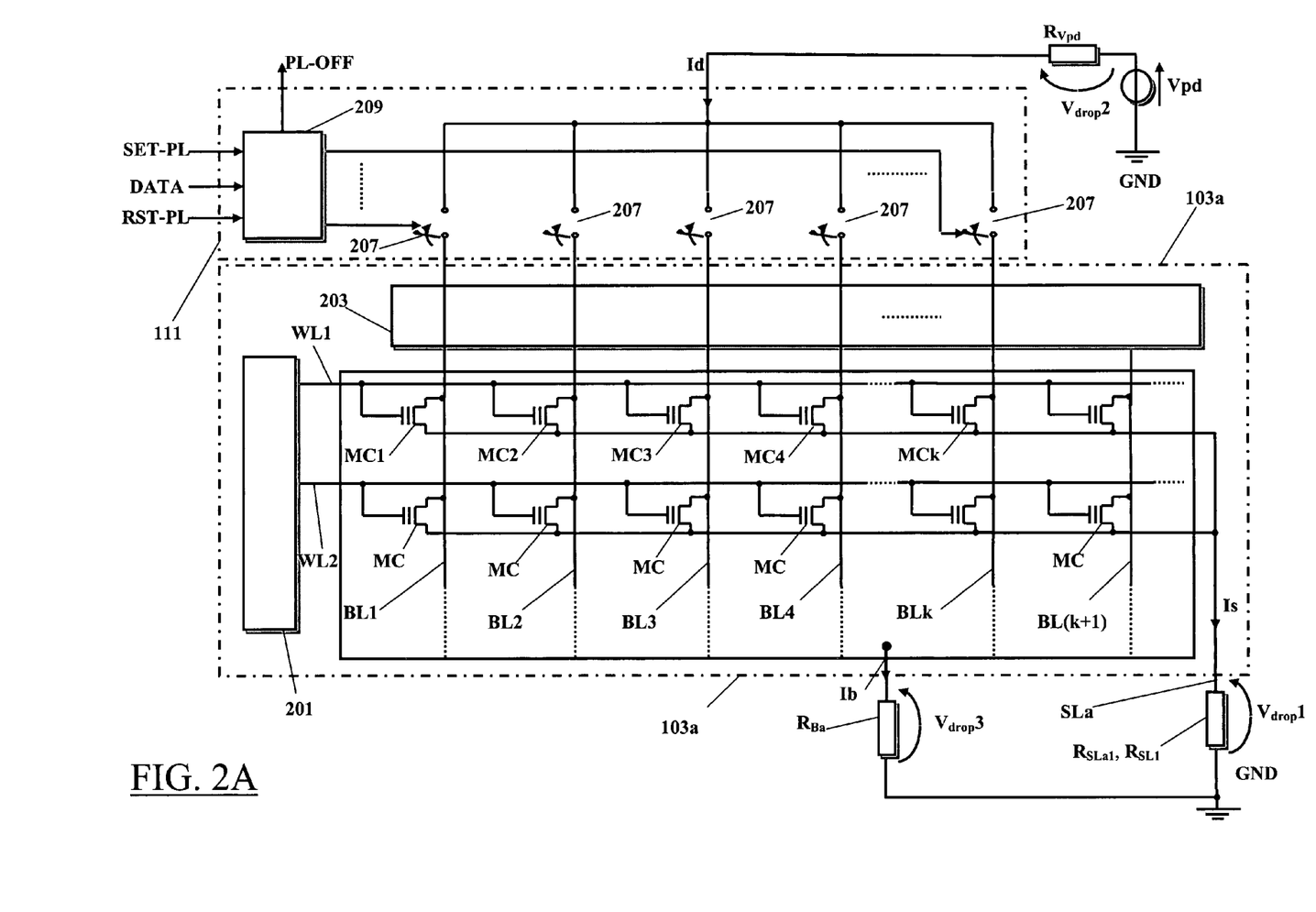
FIG. 2A schematically shows in greater detail a memory sector of the memory of FIG. 1, and the associated program load circuit, in a program operation circuit configuration.

Passing now to FIG. 2A, there is schematically shown in greater detail the structure of one of the memory sectors of the memory, namely the memory sector 103a, with the respective word line selector 201 and bit line selector 203. In particular, FIG. 2A depicts the circuit configuration in the case of a program operation. The word line selector 201 allows selecting one of the plurality of word lines WL1, WL2, . . . of the memory cell array of the memory sector 103a. Conventionally, the selection of the word line is carried out decoding a memory address (not shown). The potential of the selected word line, for example the word line WL1, is brought to a prescribed value (word line read voltage or word line program voltage), depending on the operation to be conducted on the memory cells of that word line; the potential of the unselected word lines is typically kept to the reference voltage GND. The bit line selector 203, also operating a decoding of the memory address, allows selecting a group or packet of bit lines (in the shown example, the packet of bit lines BL1–BLk) among the plurality of bit lines BL1–BL(k+1), . . . of the memory cell array. A packet of bit lines may for example include sixteen, thirty-two or even sixty-four bit lines or more. The bit lines of a same packet need not be physically adjacent bit lines in the memory cell array: for example, the bit lines of a same packet may be one every eight or sixteen bit lines of the memory cell array of the memory sector. The selected bit lines are connected to the program load circuit 111, while the unselected bit lines are left disconnected (floating); alternatively, the unselected bit lines are kept grounded.

FIG. 2A also shows schematically but in greater detail than FIG. 1 the program load circuit 111. The circuit comprises one program load circuit branch for each bit line of a selected bit line packet. A generic program load circuit branch comprises a switch 207, for example a MOSFET. The switch 207 is connected in series between the voltage supply line carrying the program drain voltage Vpd and the respective bit line of the selected packet. A program load control circuit 209 receives the controls signals SET-PL, RST-PL and the write pattern DATA, and accordingly controls the switches 207 of the program load circuit branches.

Figure 2B:
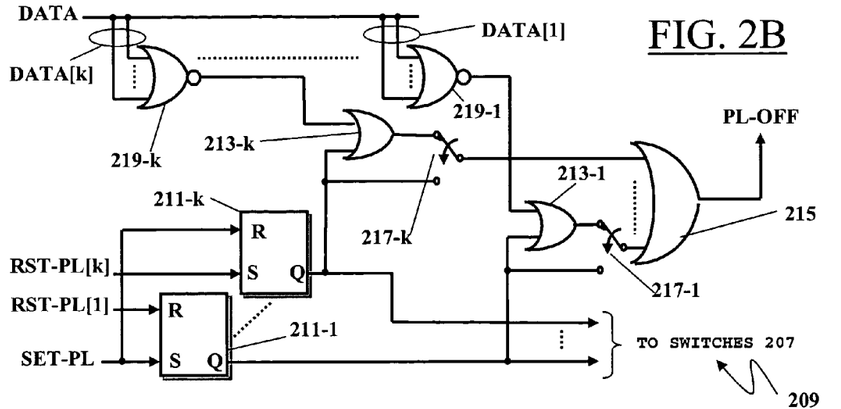
FIG. 2B schematically shows a program load control circuit for controlling the program load circuit.

FIG. 2B shows the structure of the program load control circuit 209 according to an embodiment of the present invention. Each switch 207 is controlled independently by a respective control circuit (only two of the switch control circuits are shown in FIG. 2B, for the sake of simplicity), in the shown example comprising a flip-flop 211-1, . . . , 211-k. Each flip-flop 211-1, . . . , 211-k receives the control signal SET-PL from the memory control circuit 119, and a respective control signal RST-PL[1], . . . , RST-PL[k] part of the control signals RST-PL generated by the comparator circuit 121. The asserted/deasserted state of a generic one of the signals RST-PL[1], . . . , RST-PL[k] depends on the result of the comparison, performed by the comparator circuit 121, between the corresponding bit (or group of bits, in the case of a multi-level memory) DATA[1], . . . , DATA[k] of the data word DATA to be written into the selected memory cells, and the data bit (or group of bits, in the case of a multi-level memory) read by the sense amplifier circuit 113 from the corresponding memory cell during the program verify phase. In particular, the control signal SET-PL is fed to a set input S of all the flip-flops 211-1, . . . , 211-k; the control signal RST-PL[1], . . . , RST-PL[k] is fed to a reset input R of the respective flip-flop 211-1, . . . , 211-k. An output Q of each flip-flop 211-1, . . . , 211-k, which is asserted (logic state "1") when the flip-flop is in the set state, and is deasserted (logic state "0") when the flip-flop is the reset state, controls the open/closed state of the associated program load circuit branch switch 207. When a generic flip-flop 211-1, . . . , 211-k is in the set state, the switch 207 of the associated program load circuit branch is closed and a conductive path is established between the program drain voltage supply line and the corresponding bit line of the selected packet; in this condition, the memory cells of the bit line receive on their drain terminals the drain programming voltage carried by the programming drain voltage supply line. If a flip-flop is in the reset state, the associated switch 207 is open, and the corresponding bit line is left floating (alternatively, the bit line may be grounded); the memory cells of the bit line do not receive on their drain terminal the programming drain voltage. The state of the switch 207 in the generic program load circuit branch is thus stored in the associated flip-flop 211-1, . . . , 211-k.

The output of each flip-flop 211-1, . . . , 211-k is additionally fed to a respective OR gate 213-1, . . . , 213-k, together with an output of an associated NOR gate 219-1, . . . , 219-k fed with a respective portion (including one bit, in the case of a two-level memory, or group of bits, in the case of a multi-level memory) DATA[1], . . . , DATA[k] of the write mask DATA. The outputs of all the OR gates 213-1, . . . , 213-k are logically OR-ed together in an OR logic gate 215 to generate a control signal PL-OFF that is fed back to the memory control circuit 119. The signal PL-OFF is used by the memory control circuit 119 to determine the current state of the program load circuit branches. Switches 217-1, . . . , 217-k, controlled by the memory control circuit 119, allows bypassing the OR gates 213-1, . . . , 213-k, thereby the outputs of the flip-flops 211-1, . . . , 211-k are directly connected to the OR gate 215 and the state of the control signal PL-OFF is not affected by the write mask DATA.

It can be appreciated that the parasitic resistances $R_{SLa1}$ and $R_{SL1}$ affect the effective source potential of the memory cells in the memory page being programmed; by memory page there is intended a group of memory cells belonging to a selected word line and to a selected packet of bit lines, such as the memory cells MC1 to MCk in FIG. 2A. A voltage drop $V_{drop}1$ across the parasitic resistances $R_{SLa1}$ and $R_{SL1}$ depends on the current Is flowing through the source line during programming. Similarly, the parasitic resistance $R_{Vpd}$ affects the effective drain potential applied, through the program load circuit 111, to the memory cells of the memory page being programmed; also in this case, a voltage drop $V_{drop}2$ across the parasitic resistance $R_{Vpd}$ depends on the current Id sunk by the memory cells under programming. Moreover, the parasitic resistance $R_{Ba}$ affects the effective bulk potential of the memory cells under programming, and a voltage drop $V_{drop}3$ across this parasitic resistance depends on the bulk current Ib.

The higher the currents Is, Id and Ib, the higher the voltage drops $V_{drop}1$, $V_{drop}2$ and $V_{drop}3$, the higher the deviation of the memory cell source, drain and bulk potentials from the expected values (respectively, ground GND, programming drain voltage Vpd and ground GND).

Figure 3:
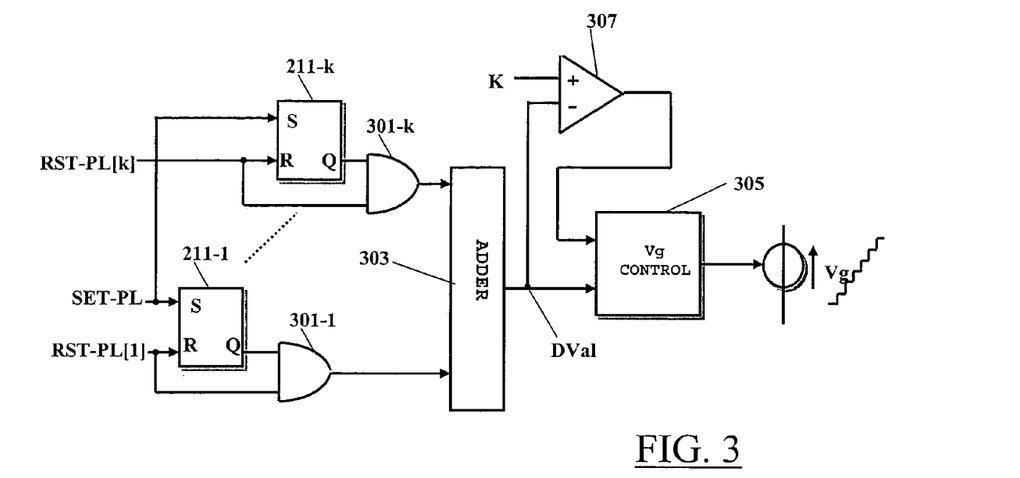
FIG. 3 schematically shows a circuit arrangement adapted to implement a programming method according to an embodiment of the present invention.

FIG. 3 schematically shows a circuit arrangement adapted to implement a programming method according to an embodiment of the present invention, which will be described in the following in connection with FIGS. 4A and 4B. The output Q of each flip-flop 211-1, . . . , 211-k controlling the open/closed state of a respective program load circuit branch switch 207 is fed to a first input of a respective AND gate 301-1, . . . , 301-k; a second input of each AND gate 301-1, . . . , 301-k is fed with the control signal RST-PL[1], . . . , RST-PL[k] feeding the reset input of the respective flip-flop 211-1, . . . , 211-k. The outputs of all the AND gates 301-1, . . . , 301-k feed an adder circuit 303. An output DVal of the adder circuit 303, carrying a value equal to the sum of logic "1"s present at the adder circuit input, is fed to a program gate voltage control circuit 305, controlling the gate voltage generator Vg. The output DVal of the adder circuit 303 is also fed to a comparator 307, comparing the value present on the output DVal of the adder circuit 303 with a prescribed threshold value K; an output of the comparator 307, which is asserted when the value present at the output DVal of the adder circuit 303 is greater than the prescribed threshold value K, feeds the program gate voltage control circuit 305. It can be appreciated that when a generic program load circuit branch, initially enabled (switch 207 closed) is to be disabled (switch 207 open), the respective control signal RST-PL[1]I, . . . , RST-PL[k] and the output Q of the respective flip-flop 211-1, . . . , 211-k are both at the "1" logic level for a given time interval, before the flip-flop content is updated, so that the output of the associated AND gate 301-1, . . . , 301-k is a logic "1" during that time interval; to this purpose, updating of the flip-flops may be conditioned by an enable signal, not shown, generated by the memory control circuit 119, or by the comparator circuit 121, and properly delayed with respect to the control signal RST-PL[1], . . . , RST-PL[k]. The adder circuit 303 thus adds up all the logic "1"s present at the outputs of the AND gates 301-1, . . . , 301-k, and the value present at the output DVal of the adder circuit provides an indication of the number of program load circuit branches that will pass from the enabled to the disabled state.

Figure 4A:
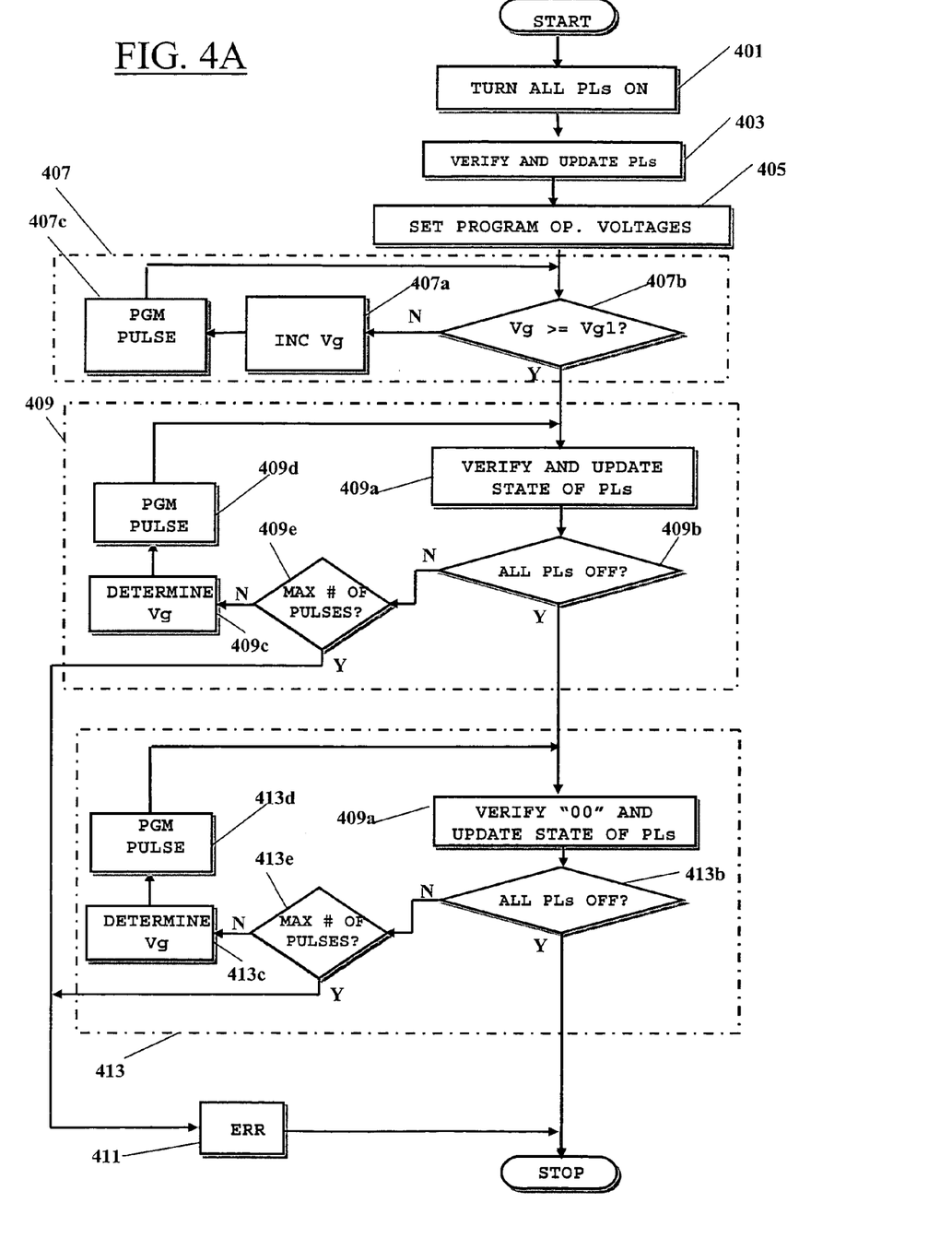
FIGS. 4A and 4B are flowcharts schematically showing the main steps of a programming method according to an embodiment of the present invention.
Figure 4B:
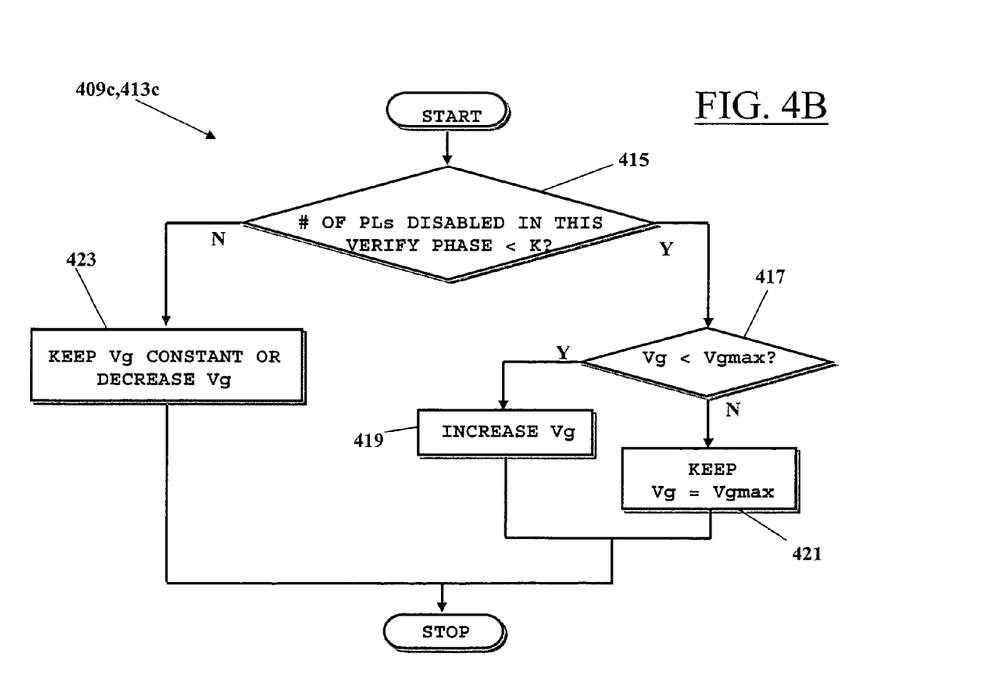

FIGS. 4A and 4B are flowcharts schematically showing the main steps of a programming operation conducted according to a method in accordance to an embodiment of the present invention.

Figure 5:
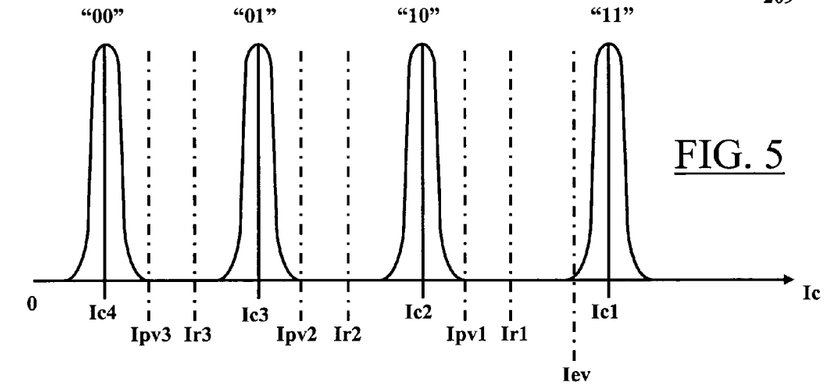
FIG. 5 is a diagram showing the relation between memory cell currents, standard read reference current and program verify read reference current, in the case of a four-level memory.

In particular, the programming operation discussed hereinbelow by way of example relates to a multi-level memory, for example a four-level memory. The operation flow will be hereinafter described in conjunction with FIG. 5, showing schematically an arrangement of current references adopted in the sense amplifier circuit 113 for reading the memory cells in standard read and program verify read conditions. In particular, a horizontal axis Ic represents memory cell current values. Ir1, Ir2 and Ir3 and Ipv1, Ipv2 and Ipv3 represent reference current values used for discriminating the four possible programming states of memory cells in standard read conditions and in program verify read conditions, respectively; Iev represent a reference current value used in erase verify read conditions for ensuring that the memory cells are erased. Ic1, Ic2, Ic3 and Ic4 represent possible values of current sunk by memory cells in each one of the four possible programming states; in particular, Ic1, Ic2, Ic3 and Ic4 are assumed to be the mean values of statistical distributions of currents for memory cells in the different programming states ("11", "10", "01" and "00").

Referring to FIG. 4A, all the program load circuit branches are initially enabled (block 401). To this purpose, the memory control circuit 119 asserts the control signal SET-PL: all the flip-flops 211-1, . . . , 211-k are put in the set state, and all the switches 207 are closed.

A memory page is selected. Then (block 403) the memory cells of the selected memory page are accessed in program verify read conditions, for ascertaining their programming state, and the retrieved data are compared by the comparator 121 to the data word DATA to be written into the selected memory page. In particular, referring to FIG. 5, in an embodiment of the present invention only the memory cells which, depending on the specific data word DATA, are intended to store a "10" and a "01" are verified at this step. A standard read gate voltage (e.g., approximately 5V) is applied to the selected word line, and the sense amplifier circuit 113 is controlled to compare the memory cell current with the program verify reference currents Ipv1, Ipv2 and Ipv3 (instead of the standard read reference currents Ir1, Ir2 and Ir3). The memory cells are declared to be already in the desired programming state if they will have to store a "11", or if they will have to store a "01" and Ic<Ipv2, or if they will have to store a "10" and Ic<Ipv1.

Depending on the result of the comparison, the comparator circuit 121 asserts/deasserts the control signals RST-PL, thereby selectively resetting the flip-flops 211-1, . . . , 211-k associated with program load circuit branches corresponding to those memory cells of the selected memory page that are intended to store a "11", a "10" or a "01". These program load circuit branches are thus selectively kept enabled or they are disabled, depending on whether the respective memory cell is to be programmed or, respectively, is declared to be already in the desired programming state. The program load circuit branches associated with memory cells intended to store a "00" are instead kept enabled. In this way, only those memory cells that are not declared to be already in the desired state will be applied programming pulses. It is observed that once a program load circuit branch is disabled, it cannot be re-enabled during a same programming operation. In other words, the control signal SET-PL is asserted only once, at the beginning of the program operation.

The programming voltages are then set up (block 405); in particular, the gate voltage Vg is set equal to an initial voltage (Vgin in FIGS. 6A, 6B and 6C), e.g. approximately equal to 1.5 V.

A first loop 407 is then entered, providing for applying to the memory cells of the selected memory page a number of programming pulses (block 407c) with a gate voltage Vg increasing at each programming pulse (block 407a), until a prescribed gate voltage is reached, for example approximately 3V (block 407b, wherein Vg1 denotes the prescribed gate voltage to be reached). For example, at each iteration of the loop the gate voltage is increased by approximately 300 mV. During this first loop, the programming state of the memory cells is not verified after each programming pulse. At each programming pulse, the threshold voltage of the memory cells whose program load circuit branches are enabled increases of a relatively well-known amount.

At the end of the loop 407, a second loop 409 is entered. At each iteration of the second loop 409, the memory cells are again accessed in program verify read conditions (block 409a), and the respective programming state ascertained, to determine whether some cells have already been brought to the desired programming state. In particular, as in the previous program verify step (block 403), only the memory cells intended to store a "10" and a "01" are verified at this step. The standard read gate voltage is applied to the selected word line, and the sense amplifier circuit 113 is controlled to compare the memory cell current with the program verify reference currents Ipv1, Ipv2 and Ipv3. The memory cells are declared to have been brought to the desired programming state if they are intended to store a "01" and Ic<Ipv2, or if they are intended to store a "10" and Ic<Ipv1. The program load circuit branches are accordingly kept enabled or disabled. The program load circuit branches associated with memory cells intended to store a "00" are kept enabled. Then, it is ascertained whether all the program load circuit branches associated with cells intended to store a "10" or a "01" are already disabled (block 409b); to this purpose, the memory control circuit 119 keeps the switches 217-1, . . . , 217-k turned onto the output of the associated OR gate 213-1, . . . , 213-k, and senses the control signal PL-OFF; it is observed that, in this condition, thanks to the provision of the OR gates 213-1, . . . , 213-k, the state of the control signal PL-OFF is not affected by the state of the flip-flops 211-1, . . . , 211-k associated with memory cells intended to store a "00". In the negative case (the control signal PL-OFF is deasserted, meaning that some of the program load circuit branches associated with memory cells intended to store a "10" or a "01" are still enabled), the programming gate voltage Vg for the next programming pulse is determined (block 409c) and another programming pulse is selectively applied to the memory cells still not programmed (block 409d). Preferably, before applying another programming pulse, it is checked whether, in the iterations of the loop 409, a maximum allowed number of programming pulses is reached (block 409*e*); if the maximum number of programming pulses has been reached, the loop 409 is exited, an error condition is declared (block 411) and the programming routine stops.

In particular, as shown in FIG. 4B, the programming gate voltage Vg for the next programming pulse is determined as follows. For example, by means of a circuit arrangement such that the exemplary one shown in FIG. 3, the number of program load circuit branches that have been disabled during the current iteration of the loop 409 is first determined. In other words, the number of cells that have reached the desired programming status after the application of the last programming pulse is determined. If such a number is detected to be lower than a prescribed number K (block 415), the programming gate voltage Vg is increased (block 419) or, if the programming gate voltage has already reached a predefined maximum value (Vgmax, block 417), the programming gate voltage is kept at that maximum value (block 421). If on the contrary the number of program load circuit branches that have been disabled in the course of the current iteration of the loop 409 results to be higher than the prescribed number K, the programming gate voltage Vg is not increased, but is kept constant at the current value or even decreased by one or more steps.

When all the program load circuit branches associated with cells intended to store a "10" or a "01," are found to be disabled (a situation detected by the memory control circuit 119 on the basis of the state of the control signal PL-OFF), a third loop 413 is entered. In this third loop 413, at each iteration the memory cells intended to store a "00" are accessed in program verify condition. A read gate voltage higher than the standard read gate voltage (e.g., 6V) is applied to the selected word line, and the sense amplifier circuit 113 compares the current Ic sunk by the memory cells to the program verify reference currents Ipv1, Ipv2 and Ipv3. If for any given cell under verify it results to be Ic<Ipv3, the respective program load circuit branch is disabled (block 413*a*).

Then, it is ascertained whether all the program load circuit branches result to be disabled (block 413*b*); for this operation, the switches 217-1, . . . , 217-k are turned onto the outputs of the associated flip-flops 211-1, . . . , 211-k. In the negative case (some program load circuit branches are still enabled), the programming gate voltage for the next programming pulse is determined (block 413*c*), in the same manner as discussed before in connection with the loop 409, and another programming pulse is selectively applied to the memory cells still not programmed (block 413*d*). As described in the foregoing, before applying another programming pulse, it is preferably checked whether, in the iterations of the loop 413, a maximum allowed number of programming pulses is reached (block 413*e*): if the maximum number of programming pulses has been reached, the loop 413 is exited, an error condition is declared (block 411) and the programming routine stops.

When all the program load circuit branches are eventually found to be disabled, the programming routine ends.

Figure 6A:
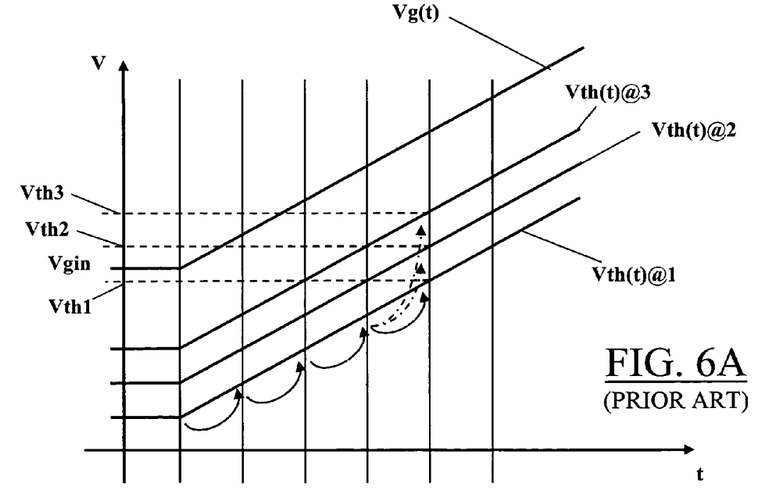
FIG. 6A is a time diagram showing the evolution of a memory cell gate voltage and threshold voltage in a conventional programming method.

FIG. 6A schematically shows the evolution of the threshold voltage of a generic memory cell in the case where the programming gate voltage is increased indiscriminately at each programming pulse, until a maximum programming gate voltage is reached, and then kept constant at such a value. The ramp Vg(t) represents the evolution in time of the programming gate voltage (the actual staircase-like evolution being approximated in the drawing by a straight line). The curves Vth(t)@1, Vth(t)@2 and Vth(t)@3 represent the corresponding evolution of the memory cell threshold voltage in three conditions, differing from each other by one or more of the electric potentials applied to the drain, source and bulk electrodes of the memory cell. Let it be assumed that the target memory cell threshold voltage is Vth1, and that the threshold voltage of the memory cell evolves following the characteristic curve Vth(t)@1; if, after having applied a given number of programming pulses (for simplicity of the drawings, three programming pulses), a relatively high number of other memory cells belonging to the same memory page as the memory cell considered are verified to be programmed, and the respective program load circuit branches disabled, the lower values of the currents Id, Is and Ib flowing through the parasitic resistances $R_{Vpd}$, $R_{SLa}$, $R_{SL}$ and $R_{Ba}$ in the next programming pulse may cause the biasing conditions of the memory cell to be so different that the characteristic curve describing the evolution of the memory cell threshold voltage becomes Vth(t)@2 or even Vth(t)@3. Due to this, the application of the next programming pulse does not cause, as expected, the memory cell threshold voltage to increase to the target value Vth1; the threshold voltage shift is instead higher than expected, and the memory cell threshold voltage jumps to Vth2 or even Vth3: in other words, the memory cell may be over-programmed, and be brought into an incorrect programming state (e.g., "01" or even "00" instead of "10", or "00" instead of "01"). The only way to recover this condition is to erase the memory cell (and thus all the memory cells of the same page), and repeating the program operation.

Figure 6B:
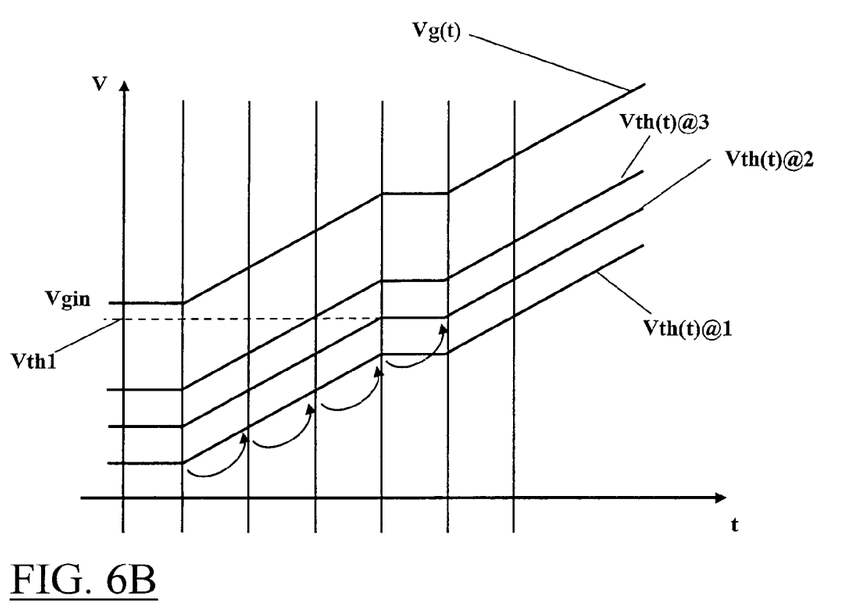
FIGS. 6B and 6C are time diagrams showing the evolution of a memory cell gate voltage and threshold voltage in the programming method of FIGS. 4A and 4B.
Figure 6C:
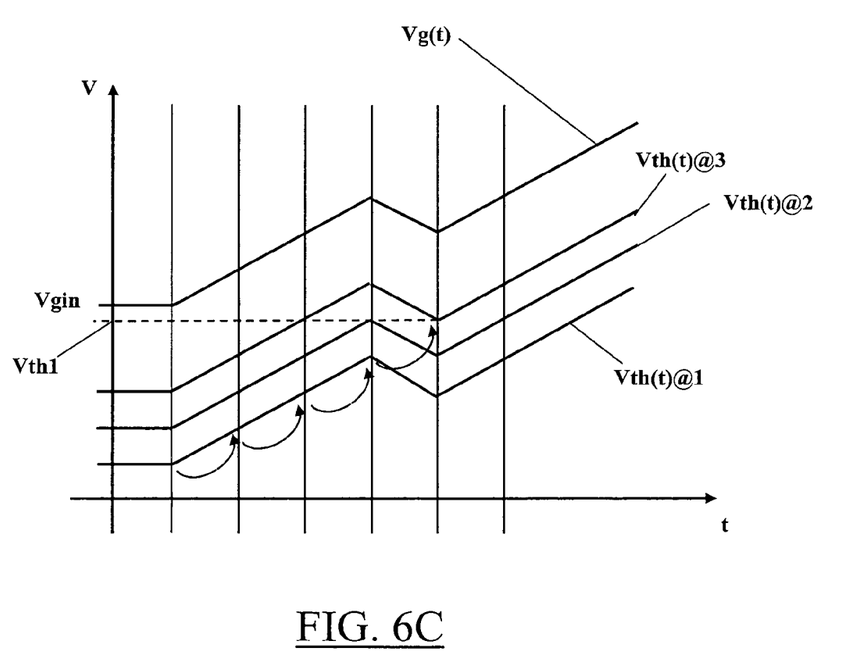

FIGS. 6B and 6C show instead how, by the method according to an embodiment of the present invention, these problems are not incurred. In particular, if it is ascertained that the number of program load circuit branches that are to be disabled at a given iteration of the loop 409 or 413 exceeds the prescribed number K, the programming gate voltage Vg is not increased of the prescribed step, but it is instead kept constant (FIG. 6B) or even decreased of one or more steps (FIG. 6C). As a consequence, even if the characteristic curve describing the evolution of the memory cell threshold voltage changes from Vth(t)@1 to Vth(t)@2 or even Vth(t)@3, the change in the shape of these characteristic curves (following the change in the shape in the curve Vg(t)) ensures that the target memory cell threshold voltage Vth1 is not exceeded.

The parameter K may also be substituted for by two or more different parameters, thereby allowing to finely control the change to be applied to the programming gate voltage Vg. For example, if the value DVal, calculated by the adder circuit 303, is lower than a first prescribed value, the programming gate voltage is normally increased by one step; if the value DVal is equal to or higher than the first prescribed value, but lower than a second prescribed value, the programming gate voltage is kept constant; if the value DVal is equal to or higher than the second prescribed value, the programming gate voltage is decreased by one step. The extent to which the programming gate voltage is decreased may further be made dependent on the value DVal.

Referring back again to FIGS. 4A and 4B, it is observed that in the loop 413 it is possible to avoid the control of the programming gate voltage based on the number of program load circuit branches that are disabled after a given programming pulse; in fact, an over-programming of the memory cells intended to store a "00" does not cause errors, but merely cause such memory cells to be relatively harder to be erased. However, it is advantageous to implement the proposed control also for these cells, since in this way over-programming can be avoided, which means a reduced erase time and reduced stresses applied to the cells. Similar considerations apply in the case of two-level memory cells.

It is pointed out that establishing the number of program load circuit branches that are progressively disabled after the application of the programming pulses is just one way of forecasting a change in memory cell biasing conditions between two consecutive programming pulses; other ways of forecasting such a change in biasing conditions can be envisaged.

The present invention can be applied in general to any kind of electrically programmable semiconductor memory, being it an EPROM, an EEPROM or a Flash memory; in particular, the invention can be applied to either two-level memories or to multi-level memories.

While there has been illustrated and described what are presently considered to be the preferred embodiments of the present invention, it will be understood by those of ordinary skill in the art that various other modifications may be made, and equivalents may be substituted, without departing from the true scope of the present invention.

Additionally, many modifications may be made to adapt a particular situation to the teachings of the present invention without departing from the central inventive concept described herein. Furthermore, an embodiment of the present invention may not include all of the features described above. Therefore, it is intended that the present invention not be limited to the particular embodiments disclosed, but that the invention include all embodiments falling within the scope of the appended claims.

What is claimed is:

1. A method of programming an electrically programmable memory, comprising:
    applying at least one first programming pulse to a group of memory cells of an electrically programmable memory;
    accessing the memory cells of the group to ascertain a programming state thereof; and
    applying at least one second programming pulse to those memory cells in the group whose programming state is not ascertained to correspond to a desired programming state, varying a voltage applied to a control electrode of the memory cells between the at least one first programming pulse and the at least one second programming pulse, wherein the varying the control electrode voltage comprises:
    forecasting a change in biasing conditions of the memory cells in the group between the at least one first and at least one second programming pulses; and
    varying the control electrode voltage according to the forecasted change in biasing conditions.

2. The method according to claim 1, further comprising: repeating the steps of applying at least one first programming pulse, accessing, and applying at least one second programming pulse, until a programming state of all the memory cells in the group is ascertained to correspond to a desired programming state.

3. The method according to claim 1, wherein the forecasting a change in biasing conditions comprises determining a number of memory cells in the group whose programming state is ascertained to correspond to a desired programming state after applying the first programming pulse.

4. The method according to claim 3, wherein the varying the control electrode voltage comprises increasing, keeping constant or decreasing the control electrode voltage depending on the number of memory cells in the group whose programming state is ascertained to correspond to a desired programming state after applying the first programming pulse.

5. The method according to claim 4, wherein the increasing, keeping constant or decreasing the control electrode voltage comprises increasing the control electrode voltage if the number is lower than a first prescribed value, keeping constant the control electrode voltage if the number is higher than the first prescribed value but lower than a second prescribed value, and decreasing the control electrode voltage if the number is higher than the second prescribed value.

6. The method according to claim 5, further comprising: repeating the acts of applying at least one first programming pulse, accessing and applying at least one second programming pulse until a programming state of all the memory cells in the group is ascertained to correspond to a desired programming state.

7. The method according to claim 1, wherein the electrically programmable memory comprises at least one memory of type of at least one of EPROM, EEPROM, and Flash memory.

8. A circuit for programming memory cells of an electrically programmable memory, comprising:
    a circuit for applying programming pulses to selected groups of memory cells of an electrically programmable memory;
    a variable voltage generator for supplying a variable programming voltage to a control electrode of the memory cells in the group; and
    a program verify circuit for accessing the memory cells in the group, ascertaining a programming state thereof and causing programming pulses to be repeatedly applied to the memory cells in the group until the programming state thereof is not ascertained to correspond to a desired programming state, varying the control electrode voltage; wherein it comprises
    means for forecasting a change in memory cell bias conditions between successive programming pulses and for causing the variable voltage generator to generate a voltage depending on the forecasted change in memory cell bias conditions.

9. The circuit of claim 8, wherein the means for forecasting a change includes means for counting a number of memory cells whose programming state is ascertained to correspond to a desired programming state after a programming pulse is applied.

10. The circuit of claim 9, wherein the circuit for applying programming pulses includes a number of programming circuit branches equal to a number of cells in a selected group, the program verify circuit causing the programming circuit branches associated with the memory cells whose programming state is ascertained to correspond to a desired programming state to be turned into a disabled state, and the means for counting the number of memory cells includes means for counting the number of programming circuit branches that are turned into a disabled state after a programming pulse is applied.

11. The circuit of claim 10, wherein the means for forecasting comprises means for comparing the number of programming circuit branches that are turned into a disabled state after a programming pulse is applied to at least one prescribed number, the voltage generated by the variable voltage generator depending on the result of such comparison.

12. The circuit of claim 8, wherein the electrically programmable memory comprises at least one memory of type of at least one of EPROM, EEPROM, and Flash memory.

* * * * *